(12) United States Patent
Abdo (10) Patent No.: US 11,201,274 B2
(45) Date of Patent: Dec. 14, 2021

(54) ENTANGLED MICROWAVE-PHOTON-PAIR GENERATOR

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 32 days.

(21) Appl. No.: 16/704,794

(22) Filed: Dec. 5, 2019

(65) Prior Publication Data
US 2021/0234084 A1 Jul. 29, 2021

(51) Int. Cl.
H04B 10/70 (2013.01)
H01L 39/02 (2006.01)
H03K 3/38 (2006.01)

(52) U.S. Cl.
CPC ............ *H01L 39/025* (2013.01); *H03K 3/38* (2013.01); *H04B 10/70* (2013.01)

(58) Field of Classification Search
None
See application file for complete search history.

(56) References Cited

U.S. PATENT DOCUMENTS

| | | | |
|---|---|---|---|
| 7,639,953 B2 | 12/2009 | Spillane et al. |
| 9,354,366 B2 | 5/2016 | Jain |
| 9,985,614 B2 | 5/2018 | Abdo |
| 10,129,021 B2 | 11/2018 | Jeong et al. |

(Continued)

FOREIGN PATENT DOCUMENTS

| | | |
|---|---|---|
| EP | 3262762 A1 | 1/2018 |
| JP | 5753543 B2 | 7/2015 |
| WO | 2018183588 A1 | 10/2018 |

OTHER PUBLICATIONS

Dambach et al., Generating entangled quantum microwaves in a Josephson-photonics device, 2017, IOP Publishing (Year: 2017).*

(Continued)

*Primary Examiner* — Jai M Lee
(74) *Attorney, Agent, or Firm* — Henry J. Daley; Venable LLP (57) ABSTRACT

A quantum-mechanical photon-pair generator includes first, second, third, and fourth Josephson junctions electrically connected in a bridge circuit having first, second and third resonance eigenmodes, and a source of magnetic flux configured to provide, during operation, a magnetic flux through the bridge circuit to cause coupling between the first, second and third resonance eigenmodes when the third resonance eigenmode is excited. The photon-pair generator further includes first, second and third electromagnetic resonators having eigenmodes in resonance with the first, second and third resonance eigenmodes of the bridge circuit, respectively. The third frequency of the third resonance eigenmode is equal to a sum of a first frequency of the first resonance eigenmode plus a second frequency of the second resonance eigenmode such that, during operation, a photon having the third frequency is split into two quantum-mechanically entangled photons having the first and second frequencies, respectively.

23 Claims, 4 Drawing Sheets

(56) References Cited

U.S. PATENT DOCUMENTS

| | | | |
|---|---|---|---|
| 2017/0039481 A1* | 2/2017 | Abdo | .................... H01L 39/025 |
| 2017/0085231 A1* | 3/2017 | Abdo | ........................ H03F 1/42 |
| 2017/0091648 A1* | 3/2017 | Abdo | ..................... H03F 19/00 |
| 2018/0067182 A1 | 3/2018 | Clerk et al. | |

OTHER PUBLICATIONS

Kwiat et al., "New High-Intensity Source of Polarization-Entangled Photon Pairs", Physical Review Letters, vol. 75, No. 24, Dec. 11, 1995, 4337.

N. Bergeal et al.," Phase-preserving amplification near the quantum limit with a Josephson ring modulator", Nature, vol. 465, pp. 64-68 (2010), arXiv:0912.3407v1 [cond-mat.mes-hall] Dec. 17, 2009.

Abdo et al., "Josephson amplifier for qubit readout", Appl. Phys. Lett. 99,162506 (2011); arXiv:1103.1405v2[cond-mat.supr-con] Oct. 25, 2011.

Abdo et al., "Nondegenerate three-wave mixing with the Josephson ring modulator", Phys. Rev. B 87, 014508—Published Jan. 16, 2013, arXiv:1208.3142v1 [cond-mat.supr-con] Aug. 15, 2012.

Narla et al., "Wireless Josephson amplifier", Appl. Phys. Lett. 104,232605 (2014); arXiv:1404.4979v2 [quant-ph] Jul. 21, 2014.

N. Roch et al., "Widely Tunable, Nondegenerate Three-Wave Mixing Microwave Device Operating near the Quantum Limit", Phys. Rev. Lett. 108, 147701—Published Apr. 6, 2012, arXiv:1202.1315v1 [cond-mat.mes-hall] Feb. 6, 2012.

N. Bergeal et al., "Analog information processing at the quantum limit with a Josephson ring modulator", Nature Physics vol. 6, pp. 296-302 (2010), arXiv:0805.3452v2 [cond-mat.mes-hall] Oct. 22, 2009.

Roy et al., "Implementation of Pairwise Longitudinal Coupling in a Three-Qubit Superconducting Circuit", Phys. Rev. Applied 7, 054025—Published May 30, 2017, arXiv: 1610.07915v1 [quant-ph] Oct. 25, 2016.

Schhackert et al., "Three-Wave Mixing with Three Incoming Waves: Signal-Idler Coherent Attenuation and Gain Enhancement in a Parametric Amplifier", Phys. Rev. Lett. 111, 073903—Published Aug. 16, 2013, arXiv:1301.169v1 [physics.optics] Jan. 8, 2013.

\* cited by examiner

ENTANGLED MICROWAVE-PHOTON-PAIR GENERATOR

BACKGROUND

The currently claimed embodiments of the present invention relate to superconducting quantum mechanical devices, and more specifically, to a quantum-mechanical photon-pair generator.

Single photon generators can be very useful in a variety of quantum information processing applications such as, for example, quantum cryptography, quantum communication, and quantum computing with photons. Superconducting qubits can be used under certain conditions as single-microwave-photon generators. For example, superconducting qubits can be excited to their first excited state and then stimulated on demand to emit their excitation in the form of a microwave photon into a resonator or a transmission line.

In order to construct a non-degenerate parametric device (the Josephson parametric converter (JPC)), which is capable of amplifying and/or mixing microwave signals at the quantum limit, a Josephson ring modulator (JRM) is incorporated into two microwave resonators at an rf-current anti-node of their fundamental eigenmodes. The Josephson ring modulator (JRM) is a nonlinear dispersive element based on Josephson tunnel junctions that can perform three-wave mixing of microwave signals at the quantum limit. The JRM has four nominally identical Josephson junctions arranged in Wheatstone-like bridge configuration. The performance of the JPC including power gain, dynamical bandwidth, and dynamic range, are strongly dependent on the critical current of the Josephson junction of the JRM, the specific realization of the electromagnetic environment (i.e. the microwave resonators), and the coupling between the JRM and the resonators. However, the JPC couples the JRM to only two resonators.

SUMMARY

An aspect of the present invention is to provide a quantum-mechanical photon-pair generator including a first Josephson junction, a second Josephson junction electrically connected to the first Josephson junction, a third Josephson junction electrically connected to the second Josephson junction and a fourth Josephson junction electrically connected to the third Josephson junction and the first Josephson junction such that the first, second, third and fourth Josephson junctions are connected in a bridge circuit having a first resonance eigenmode, a second resonance eigenmode and a third resonance eigenmode. The quantum-mechanical photon-pair generator further includes a source of magnetic flux arranged proximate the bridge circuit, the source of magnetic flux is configured to provide, during operation, a magnetic flux through the bridge circuit to cause coupling between the first, second and third resonance eigenmodes when the third resonance eigenmode is excited. The quantum-mechanical photon-pair generator also includes a first electromagnetic resonator electrically connected to the first and fourth Josephson junctions at a first node therebetween and to the second and third Josephson junctions at a second node therebetween; a second electromagnetic resonator electrically connected to the first and second Josephson junctions at a third node therebetween and to the third and fourth Josephson junctions at a fourth node therebetween; and a third microwave resonator connected to the first and fourth Josephson junctions at the first node therebetween and to the second and third Josephson junctions at the second node therebetween. The first electromagnetic resonator has an eigenmode in resonance with the first resonance eigenmode of the bridge circuit. The second electromagnetic resonator has an eigenmode in resonance with the second resonance eigenmode of the bridge circuit. The third electromagnetic resonator has an eigenmode in resonance with the third resonance eigenmode of the bridge circuit. The third frequency of the third resonance eigenmode is equal to a sum of a first frequency of the first resonance eigenmode plus a second frequency of the second resonance eigenmode such that, during operation, a photon having the third frequency is split into two quantum-mechanically entangled photons having the first and second frequencies, respectively.

In an embodiment, the first electromagnetic resonator, the second electromagnetic resonator and the third electromagnetic resonator are microwave resonators. In an embodiment, the first frequency of the first resonance eigenmode, the second frequency of the second resonance eigenmode, and the third frequency of the third resonance eigenmode are in the microwave frequency range.

In an embodiment, the quantum-mechanical photon-pair generator further includes a first capacitor ($C_c$) connected in parallel with the first Josephson junction; a second capacitor ($C_c$) connected in parallel with the second Josephson junction; a third capacitor ($C_c$) connected in parallel with the third Josephson Junction; and a fourth capacitor ($C_c$) connected in parallel with the fourth Josephson junction. In an embodiment, the quantum-mechanical photon-pair generator further includes a fifth capacitor ($C_a$) connected in parallel with the bridge circuit at the first node and the second node of the bridge circuit; and a sixth capacitor ($C_b$) connected in parallel with the bridge circuit at the third node and the fourth node of the bridge circuit.

In an embodiment, the first frequency and the second frequency depend on capacitance values of the fifth capacitor ($C_a$) and the sixth capacitor ($C_b$) and the first frequency and the second frequency are selected by selecting capacitance values of the fifth capacitor ($C_a$) and the sixth capacitor ($C_b$), respectively. In an embodiment, a capacitance value of the first capacitor, a capacitance value of the second capacitor, a capacitance value of the third capacitor, and a capacitance value of the fourth capacitor are selected so that the third frequency of the third resonance eigenmode is equal to the sum of the first frequency of the first resonance eigenmode plus the second frequency of the second resonance eigenmode.

In an embodiment, the quantum-mechanical photon-pair generator further includes a seventh capacitor ($C_{cc}$) connected to a third resonator feedline coupled to the third resonator and to the first node of the bridge circuit; an eighth capacitor ($C_{ca}$) connected to a first resonator feedline coupled to the first resonator and to the first node of the bridge circuit; a ninth capacitor ($C_{cb}$) connected to a second resonator feedline coupled to the second resonator and to the third node of the bridge circuit; and a tenth capacitor ($C_{cc}$) connected to a third resonator feedline coupled to the third resonator and to the second node of the bridge circuit. The seventh, eighth, ninth and tenth capacitors are selected to satisfy a frequency hierarchy conduction such that: a coupling constant between the first, the second and third eigenmodes is less than decay rates of the first and second eigenmodes to corresponding external feedlines, and the coupling constant between the first, the second and third eigenmodes is greater than a decay rate of the third eigenmode to a corresponding external feedline.

In an embodiment, the first, second and third microwave resonators are coplanar strip-line resonators or micro-strip resonators. In an embodiment, the first, second and third microwave resonators are compact lumped-element resonators or three-dimensional cavities. In an embodiment, the source of magnetic flux is a current-carrying element to provide an electromagnetic source of magnetic flux that flux-biases the bridge circuit. In an embodiment, the source of magnetic flux is a magnetic material to provide an electromagnetic source of magnetic flux that flux-biases the bridge circuit. In an embodiment, the source of magnetic flux provides a half of flux quantum ($\varphi_0/2$). In an embodiment, the first frequency, the second frequency and the third frequency are in the microwave frequency range.

Another aspect of the present invention is to provide a quantum-mechanical non-linear circuit including a first Josephson junction; a second Josephson junction electrically connected to the first Josephson junction; a third Josephson junction electrically connected to the second Josephson junction; and a fourth Josephson junction electrically connected to the third Josephson junction and the first Josephson junction, such that the first, second, third and fourth Josephson junctions are connected in a bridge circuit. The quantum-mechanical non-linear circuit further includes a first capacitor ($C_c$) connected in parallel with the first Josephson junction; a second capacitor ($C_c$) connected in parallel with the second Josephson junction; a third capacitor ($C_c$) connected in parallel with the third Josephson Junction; a fourth capacitor ($C_c$) connected in parallel with the fourth Josephson junction; a fifth capacitor ($C_a$) connected in parallel with the bridge circuit at a first node between the first Josephson junction and the fourth Josephson junction and a second node between the second Josephson junction and the third Josephson junction; and a sixth capacitor ($C_b$) connected in parallel with the bridge circuit at the third node between the first Josephson junction and the second Josephson junction and a fourth node between the third Josephson junction and the fourth Josephson junction. The quantum-mechanical non-linear circuit has a first resonance eigenmode, a second resonance eigenmode and a third resonance eigenmode. The third frequency of the third resonance eigenmode is equal to a sum of a first frequency of the first resonance eigenmode plus a second frequency of the second resonance eigenmode such that, during operation, a photon having the third frequency is split into two quantum-mechanically entangled photons having the first and second frequencies, respectively.

In an embodiment, when in operation, the first resonance eigenmode, the second resonance eigenmode and the third resonance eigenmode are coupled by applying a magnetic field to generate a magnetic flux through the bridge circuit when the third resonance eigenmode is excited. In an embodiment, the first frequency and the second frequency depend on capacitance values of the fifth capacitor ($C_a$) and the sixth capacitor ($C_b$), respectively, and the first frequency and the second frequency are selected by selecting capacitance values of the fifth capacitor ($C_a$) and the sixth capacitor ($C_b$), respectively. In an embodiment, a capacitance value of the first capacitor, a capacitance value of the second capacitor, a capacitance value of the third capacitor, and a capacitance value of the fourth capacitor are selected so that the third frequency of the third resonance eigenmode is equal to the sum of the first frequency of the first resonance eigenmode plus the second frequency of the second resonance eigenmode.

In an embodiment, the quantum-mechanical non-linear circuit further includes a seventh capacitor ($C_{cc}$) connected to the first node of the bridge circuit; an eight capacitor ($C_{ca}$) connected to the first node of the bridge circuit and to the fifth capacitor ($C_a$); a ninth capacitor ($C_{cb}$) connected to the third node of the bridge circuit and to the sixth capacitor ($C_b$); and a tenth capacitor ($C_{cc}$) connected to the second node of the bridge circuit. The seventh, eighth, ninth and tenth capacitors are selected to satisfy a frequency hierarchy conduction such that: a coupling constant between the first, the second and third eigenmodes is less than decay rates of the first and second eigenmodes to corresponding external feedlines, and the coupling constant between the first, the second and third eigenmodes is greater than a decay rate of the third eigenmode to a corresponding external feedline.

Another aspect of the present invention is to provide a method for generating a quantum-mechanical entangled photon-pair. The method includes inputting an electromagnetic wave at a third frequency into a quantum-mechanical non-linear circuit having a first resonance eigenmode, a second resonance eigenmode and a third resonance eigenmode, the third frequency corresponding to a frequency of the third eigenmode; and applying a magnetic field to generate a magnetic flux in the quantum-mechanical non-linear circuit to couple the first eigenmode, the second eigenmode and the third eigenmode such that, a photon having the third frequency is split into two quantum-mechanically entangled photons having a first frequency of the first eigenmode and a second frequency of the second eigenmode, respectively, the third frequency being equal to a sum of the first frequency plus the second frequency.

In an embodiment, the method further includes selecting the first frequency and the second frequency by selecting capacitance values of first capacitors in the quantum-mechanical non-linear circuit. In an embodiment, the method further includes selecting capacitance values of second capacitors in the quantum-mechanical non-linear circuit so that the third frequency of the third resonance eigenmode is equal to the sum of the first frequency of the first resonance eigenmode plus the second frequency of the second resonance eigenmode. In an embodiment, the method further includes selecting capacitance values of third capacitors in the quantum-mechanical non-linear circuit so as to satisfy a frequency hierarchy conduction such that a coupling constant between the first, the second and third eigenmodes is less than a decay rate of the first eigenmode to a corresponding external feedline and a decay rate of the second eigenmode to a corresponding external feedline, and the coupling constant between the first, the second and third eigenmodes is greater than a decay rate of the third eigenmode to a corresponding external feedline.

The present quantum-mechanical photon-pair generator is based on coupling a bridge circuit to three electromagnetic resonators. quantum-mechanical photon-pair generator is configured to down-convert a higher frequency photon entering one port of the generator into a pair of quantum-mechanical entangled photons having lower frequencies. The pair of quantum-mechanical entangled photons are generated on-demand and thus can be useful in remote quantum-mechanical entanglement of superconducting qubits, quantum communication, quantum cryptography, etc.

BRIEF DESCRIPTION OF THE DRAWINGS

Concepts of the present invention, as well as methods of operation and functions of related elements of structure and combinations of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
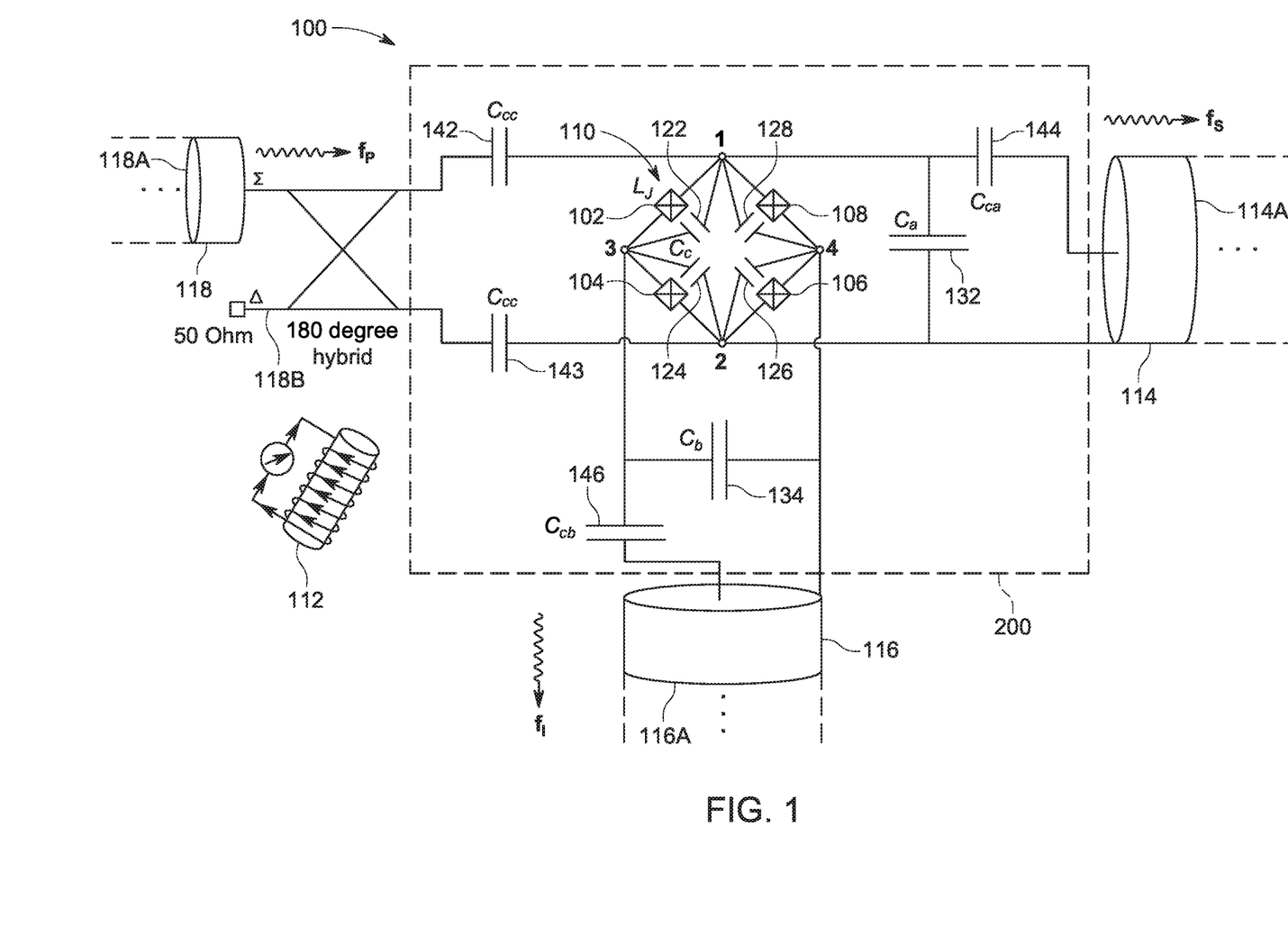
FIG. 1 is a schematic diagram of a quantum-mechanical photon-pair generator, according to an embodiment of the present invention.

FIG. 1 is a schematic diagram of a quantum-mechanical photon-pair generator 100, according to an embodiment of the present invention. The quantum-mechanical photon-pair generator 100 includes a first Josephson junction 102, and a second Josephson junction 104 electrically connected to the first Josephson junction 102. The quantum-mechanical photon-pair generator 100 also includes a third Josephson junction 106 electrically connected to the second Josephson junction 104 and a fourth Josephson junction 108 electrically connected to the third Josephson junction 106 and the first Josephson junction 102 such that the first Josephson junction 102, the second Josephson junction 104, the third Josephson Junction 106, and the fourth Josephson junction 108 are connected in a bridge circuit 110 having a first resonance eigenmode (X-mode), a second resonance eigenmode (Y-mode) and a third resonance eigenmode (Z-mode).

The term "bridge circuit" as used in this specification is intended to refer to a circuit that has at least four Josephson junctions connected similar to the arrangement of resistors in a Wheatstone bridge circuit. However, the "bridge circuit" as used herein is a quantum mechanical circuit, not a classical electrical circuit.

Figure 2A:
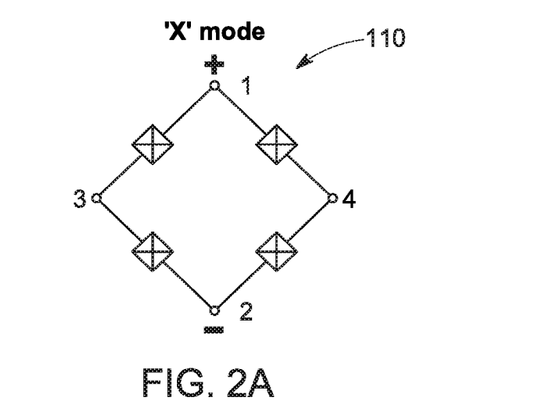
FIG. 2A-2C are schematic diagrams of a bridge circuit having a first resonance eigenmode, a second resonance eigenmode and a third resonance eigenmode, according to an embodiment of the present invention.
Figure 2B:
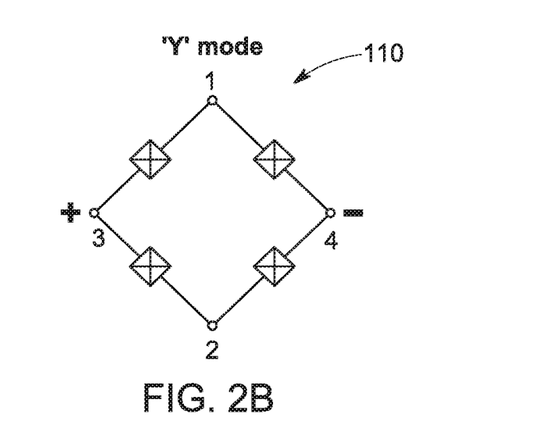
Figure 2C:
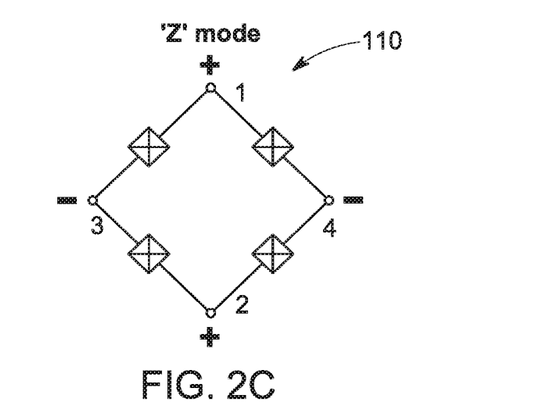

FIGS. 2A-2C show a bridge circuit 110 having a first resonance eigenmode, a second resonance eigenmode and a third resonance eigenmode, according to an embodiment of the present invention. FIGS. 2A-2C show the rf voltage polarity on the bridge nodes corresponding to the first, second, and third eigenmodes. FIG. 2A shows the bridge circuit 110 operating in the first eigenmode (X-mode). FIG. 2B shows the bridge circuit 110 operating in the second eigenmode (Y-mode). FIG. 2C shows the bridge circuit 110 operating in the third eigenmode (Z-mode). In some embodiments, the first, second and third eigenmodes are mutually orthogonal to each other. The bridge circuit 110 which can be a Josephson Ring Modulator (JRM) in some embodiments is a nonlinear dispersive circuit based on Josephson tunnel junctions (e.g., four Josephson junctions) that can perform three-wave mixing of electromagnetic signals (e.g., microwave signals) at the quantum limit. However, the broad concepts of the current invention are not limited to only four Josephson junctions. Additional Josephson junction could be included on one or more of the legs of the bridge circuit 110 according to some embodiments.

The quantum-mechanical photon-pair generator 100 also includes a source of magnetic flux 112 arranged proximate the bridge circuit 110. The source of magnetic flux 112 is configured to provide, during operation, a magnetic flux through the bridge circuit 110 to cause coupling between the first resonance eigenmode (X-mode), the second resonance eigenmode (Y-mode) and the third resonance eigenmode (Z-mode) when the third resonance eigenmode (Z-mode) is excited.

In an embodiment, the source of magnetic flux 112 is a current-carrying element to provide an electromagnetic source of magnetic flux that flux-biases the bridge circuit 110. In an embodiment, the source of magnetic flux 112 is a magnetic material to provide an electromagnetic source of magnetic flux that flux-biases the bridge circuit 110. In an embodiment, the source of magnetic flux 112 provides a half of flux quantum ($(\varphi_0/2)$).

Figure 3A:
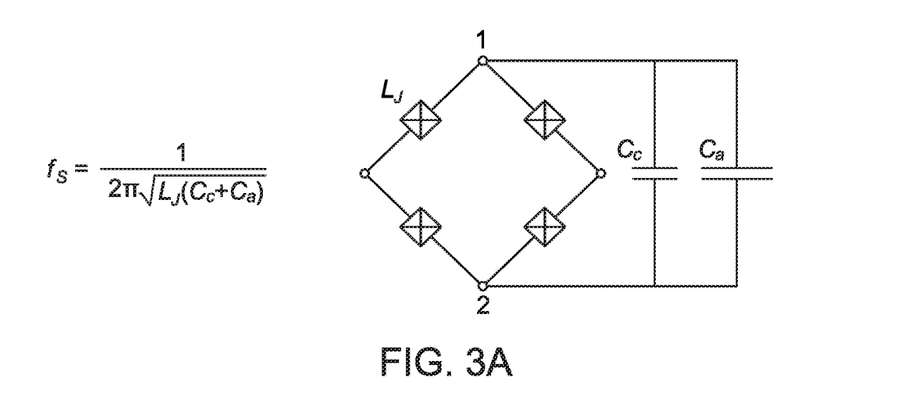
FIGS. 3A-3C are circuit diagrams corresponding to the various modes (first resonance eigenmode, second resonance eigenmode, and third resonance eigenmode) and associated resonance frequencies, according to an embodiment of the present invention.
Figure 3B:
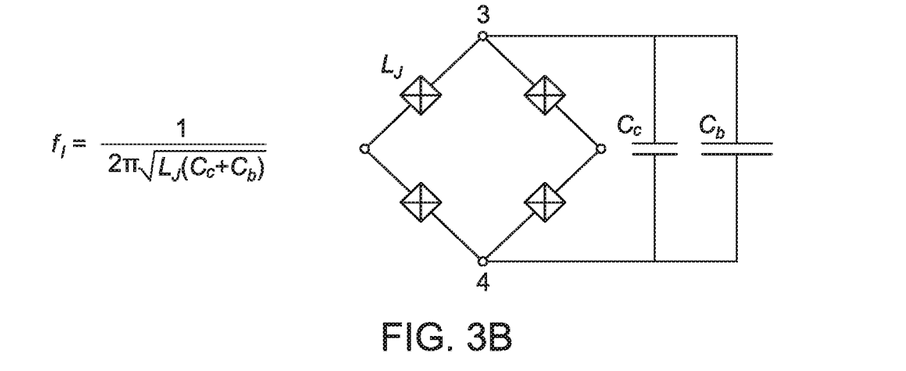
Figure 3C:
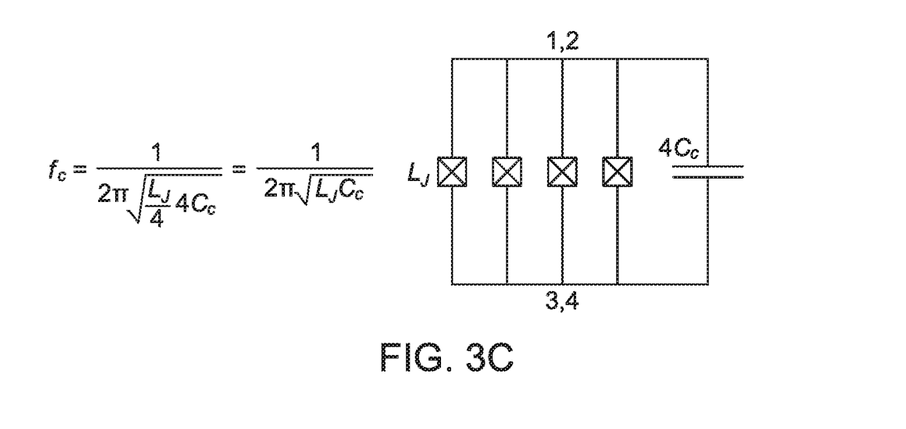

The quantum-mechanical photon-pair generator 100 further includes a first electromagnetic resonator 114 electrically connected to the first Josephson junction 102 and fourth Josephson junction 108 at a first node 1 therebetween and to the second Josephson junction 104 and third Josephson junction 106 at a second node 2 therebetween. The quantum-mechanical photon-pair generator 100 also includes a second electromagnetic resonator 116 electrically connected to the first Josephson junction 102 and the second Josephson junction 104 at a third node 3 therebetween and to the third Josephson junction 106 and the fourth Josephson junction 108 at a fourth node 4 therebetween. The quantum-mechanical photon-pair generator 100 also includes a third electromagnetic resonator 118 connected to the first Josephson junction 102 and the fourth Josephson junction 108 at the first node 1 therebetween and to the second Josephson junction 104 and the third Josephson junction 106 at the second node 2 therebetween. In FIG. 1, for purposes of illustration, the reference numerals 114, 116 and 118 corresponding to the first, second and third resonators are shown generally pointing to respective external resonator feedlines 114A, 116A and 118A that are coupled to the first electromagnetic resonator 114, the second electromagnetic resonator 116 and the third electromagnetic resonator 118. These resonator feedlines 114A, 116A and 118A carry the input and output signals into and out of the respective resonators. However, as it is understood, the first, second and third electromagnetic resonators 114, 116 and 118 include other elements. For example, the first electromagnetic resonator 114 is represented in FIG. 3A by the corresponding mode it generates, the second electromagnetic resonator 116 is represented in FIG. 3B by the corresponding mode it generates, and the third resonator 118 is represented in FIG. 3C by the corresponding mode it generates, as will be explained further in the following paragraphs.

In an embodiment, the first, second and third electromagnetic resonators 114, 116 and 118 are coplanar strip-line resonators, micro-strip resonators, lumped-element resonators or three-dimensional cavities.

The first electromagnetic resonator 114 has an eigenmode in resonance with the first resonance eigenmode (X-mode) of the bridge circuit 110. The second electromagnetic resonator 116 has an eigenmode in resonance with the second resonance eigenmode (Y-mode) of the bridge circuit 110. The third electromagnetic resonator 118 has an eigenmode in resonance with the third resonance eigenmode (Z-mode) of the bridge circuit 110. The third frequency $f_P$ of the third resonance eigenmode (Z-mode) is equal to a sum of a first frequency $f_S$ of the first resonance eigenmode plus a second frequency $f_I$ of the second resonance eigenmode such that, during operation, a photon having the third frequency $f_P$ is split into two quantum-mechanically entangled photons having the first frequency $f_S$ and the second frequency $f_I$, respectively. The first frequency $f_S$ is sometimes referred to as the signal frequency, the second frequency $f_I$ is sometimes referred to as the idler frequency, and the third frequency $f_P$ is sometimes referred to as the pump frequency. In an embodiment, the first frequency $f_S$, the second frequency $f_I$ and the third frequency $f_P$ are in the microwave frequency range, for example.

In an embodiment, the first electromagnetic resonator 114, the second electromagnetic resonator 116 and the third electromagnetic resonator 118 are microwave resonators operating in the microwave frequency range. However, as it must be appreciated, the first electromagnetic resonator 114, the second electromagnetic resonator 116 and the third electromagnetic resonator 118 can also be configured to operate in another frequency range, for example, below or above the microwave frequency range.

In an embodiment, the quantum-mechanical photon-pair generator 100 further includes a first capacitor ($C_c$) 122 connected in parallel with the first Josephson junction 102, and a second capacitor ($C_c$) 124 connected in parallel with the second Josephson junction 104. In an embodiment, the quantum-mechanical photon-pair generator 100 also includes a third capacitor ($C_c$) 126 connected in parallel with the third Josephson Junction 106, and a fourth capacitor ($C_c$) 128 connected in parallel with the fourth Josephson junction 108. Although one capacitor is shown connected in parallel with each of the Josephson junctions 102, 104, 106 and 108, two or more capacitors can also be connected in parallel with each of the Josephson junctions 102, 104, 106 and 108. For example, the two or more capacitors can be connected in series or in parallel, or both and then connected as whole in parallel with each of the Josephson junctions 102, 104, 106 and 108. In addition, although the capacitors 102, 104, 106 and 108 are shown as having a same capacitance $C_c$, the capacitors 102, 104, 106 and 108 can also have different capacitances and/or each have a different number of capacitors.

In an embodiment, the quantum-mechanical photon-pair generator 100 further includes a fifth capacitor ($C_a$) 132 connected in parallel with the bridge circuit 110 at the first node 1 and the second node 2 of the bridge circuit 110, and a sixth capacitor ($C_b$) 134 connected in parallel with the bridge circuit 110 at the third node 3 and the fourth node 4 of the bridge circuit 110. Although the capacitors 132 and 134 are shown in FIG. 1 as single capacitors, two or more capacitors can also be used instead of a single capacitor. For example, the two or more capacitors can be connected in series or in parallel, or both and as whole be used as capacitor 132 or capacitor 134.

In an embodiment, the first frequency $f_S$ and the second frequency $f_I$ depend on capacitance values of the fifth capacitor ($C_a$) 132 and the sixth capacitor ($C_b$) 134. In an embodiment, the first frequency $f_S$ and the second frequency $f_I$ are selected by selecting capacitance values of the fifth capacitor ($C_a$) 132 and the sixth capacitor ($C_b$) 134, respectively.

In an embodiment, a capacitance value of the first capacitor 122, a capacitance value of the second capacitor 124, a capacitance value of the third capacitor 126, and a capacitance value of the fourth capacitor 128 are selected so that the third frequency $f_P$ of the third resonance eigenmode is equal to the sum of the first frequency of the first resonance eigenmode plus the second frequency $f_I$ of the second resonance eigenmode.

FIGS. 3A-3C show the circuits corresponding to the various modes (first resonance eigenmode, second resonance eigenmode, and third resonance eigenmode) and their associated resonance frequencies, according to an embodiment of the present invention. For example, the first frequency of the first resonance mode $f_S$, the second frequency $f_I$ of the second resonance mode, and the third frequency $f_P$ of the third resonance mode can be expressed as follows:

$$f_s = \frac{1}{2\pi\sqrt{L_j(C_c + C_a)}} \quad (1)$$

$$f_I = \frac{1}{2\pi\sqrt{L_j(C_c + C_b)}} \quad (2)$$

$$f_P = \frac{1}{2\pi\sqrt{L_j C_c}} \quad (3)$$

where $L_j$ is the inductance of each of the Josephson junctions. In equations (1), (2) and (3), the inductances $L_j$ of the Josephson junctions are assumed to be equal. In addition, in equations (1), (2) and (3), the coupling capacitors $C_{cc}$, $C_{ca}$ and $C_{cb}$ are ignored for simplicity. They do affect the resonance frequencies to a limited degree, but their effect can be taken into account using common microwave simulation tools. Their main purpose is to couple the different external ports to the corresponding three electromagnetic resonators that include the bridge circuit 110. As shown in equations, (1), (2) and (3), the frequencies $f_S$, $f_I$, and $f_P$, are inversely proportional to the square root of the capacitances $C_a$, $C_b$, and $C_c$. Therefore, increasing the capacitances will decrease the respective frequencies.

In an embodiment, the inductance $L_j$ is selected such that the quantum-mechanical photon-pair generator 100 acts as a quantum mechanical device with discrete energy levels that can work at the single photon levels and which increases the coupling constant $g_3$ between the modes. In an embodiment, the inductance $L_j$ is selected to be in the range between 5 nH and 30 nH. Given the desired frequencies $f_S$ and $f_I$, one can find the appropriate capacitance values $C_a$ and $C_b$ of the capacitors 132 and 134, respectively, which yield these frequencies. In an embodiment, the capacitance values $C_a$ and $C_b$ of the capacitors 132 and 134, respectively are selected in the range between 10 fF and 1 pF. The capacitance value $C_c$ of the first, second, third and fourth capacitors 122, 124, 16 and 128 are selected so that the condition $f_P = f_I + f_S$ is satisfied.

In an embodiment, the quantum-mechanical photon-pair generator 100 also includes a seventh capacitor ($C_{cc}$) 142 connected to the third resonator feedline 118A and to the first node 1 of the bridge circuit 110. In an embodiment, the quantum-mechanical photon-pair generator 100 further includes an eighth capacitor ($C_{ca}$) 144 connected to the first resonator feedline 114A and to the first node 1 of the bridge circuit 110. In an embodiment, the quantum-mechanical photon-pair generator 100 also includes a ninth capacitor ($C_{cb}$) 146 connected to the second resonator feedline 116A and to the third node 3 of the bridge circuit 110. In an embodiment, the quantum-mechanical photon-pair generator 100 also includes a tenth capacitor ($C_{cc}$) 143 that couples the third resonator feedline 118A and 180-degree hybrid line 118B to the third resonator 118 corresponding to the third eigenmode. The tenth capacitor ($C_{cc}$) 143 is connected to the third resonator feedline 118A, to the 180-degree hybrid line 118B, and to the second node 2 of the bridge circuit 110. In an embodiment, the tenth capacitor ($C_{cc}$) 143 is provided so as to keep a symmetry with respect to nodes 1 and 2 when exciting the third mode (common mode).

In an embodiment, the seventh capacitor ($C_{cc}$) 142, the eighth capacitor ($C_{ca}$) 144, and the ninth capacitor ($C_{cb}$) 146 are selected to satisfy a frequency hierarchy conduction such that:

1. a coupling constant between the first, the second and the third eigenmodes $g_3$ is less than decay rates $\gamma_S$ and $\gamma_I$ of the first and second eigenmodes, respectively, to corresponding external feedlines ($g_3 < \gamma_I \sim \gamma_S$); and
2. the coupling constant between the first, the second and the third eigenmodes $g_3$ is greater than a decay rate $\gamma_P$ of the third eigenmode to a corresponding external feedline ($g_3 > \gamma_P$).

Example Implementation: The following values can be selected to generate a two-photon quantum-mechanical entangled photon-pair.

Critical current of the Josephson junctions $I_0$=40 nA.
Inductance of the Josephson junction at zero flux bias $L_{j0}=\Phi_0/I_0=8$ nH.
Inductance of the Josephson junction at half flux quantum $L_j=\sqrt{2}\Phi_0/I_0=11.3$ nH.
Magnetic flux generated by the source of magnetic flux 112, $\Phi_{ext}=\Phi_0/2$.
$f_s$=5 GHz.
$f_I$=6 GHz.
$C_a$=72 fF (selected knowing the desired output photon frequency $f_s$).
$C_b$=45 fF (selected knowing the desired output photon frequency $f_I$).
$f_P$=11 GHz ($f_P=f_s+f_I$).
$\gamma_I/2\pi=\gamma_S/2\pi=100$ MHz (decay rates of the first and second eigenmode to corresponding external feedlines).
$\gamma_P/2\pi=10$ MHz (decay rate of the third eigenmode to a corresponding external feedline).
$g_3 \sim 50$ MHz (coupling constant between the first, the second and the third eigenmodes).

As it can be understood from the above paragraphs, an aspect of the present invention is also to provide a quantum-mechanical non-linear circuit 200. The quantum-mechanical non-linear circuit 200 includes the first Josephson junction 102; the second Josephson junction 104 electrically connected to the first Josephson junction 102; the third Josephson junction 106 electrically connected to the second Josephson junction 104; and the fourth Josephson junction 108 electrically connected to the third Josephson junction 106 and the first Josephson junction 102, such that the first, second, third and fourth Josephson junctions 102, 104, 106 and 108 are connected in the bridge circuit 110.

The quantum-mechanical non-linear circuit 200 further includes the first capacitor ($C_c$) 122 connected in parallel with the first Josephson junction 102; the second capacitor ($C_c$) 124 connected in parallel with the second Josephson junction 104; the third capacitor ($C_c$) 126 connected in parallel with the third Josephson Junction 106; and the fourth capacitor ($C_c$) 128 connected in parallel with the fourth Josephson junction 108.

The quantum-mechanical non-linear circuit 200 also includes the fifth capacitor ($C_a$) 132 connected in parallel with the bridge circuit 110 at the first node 1 between the first Josephson junction 102 and the fourth Josephson junction 108 and the second node 2 between the second Josephson junction 104 and the third Josephson junction 106. The quantum-mechanical non-linear circuit 200 further includes the sixth capacitor ($C_b$) 134 connected in parallel with the bridge circuit 110 at the third node 3 between the first Josephson junction 102 and the second Josephson junction 104 and a fourth node 4 between the third Josephson junction 106 and the fourth Josephson junction 108.

The quantum-mechanical non-linear circuit 200 has the first resonance eigenmode, the second resonance eigenmode and the third resonance eigenmode. The third frequency ($f_P$) of the third resonance eigenmode is equal to the sum of a first frequency ($f_S$) of the first resonance eigenmode plus the second frequency ($f_I$) of the second resonance eigenmode such that, during operation, a photon having the third frequency ($f_P$) is split into two quantum-mechanically entangled photons having the first frequency ($f_S$) and second frequency ($f_I$).

In an embodiment, when in operation, the first resonance eigenmode, the second resonance eigenmode and the third resonance eigenmode are coupled by applying a magnetic field using the source of magnetic flux 112 to generate the magnetic flux through the bridge circuit 110 when the third resonance eigenmode is excited.

In an embodiment, the first frequency ($f_S$) and the second frequency ($f_I$) depend on capacitance values of the fifth capacitor ($C_a$) 132 and the sixth capacitor ($C_b$) 134, respectively, and the first frequency ($f_S$) and the second frequency ($f_I$) are selected by selecting capacitance values of the fifth capacitor ($C_a$) 132 and the sixth capacitor ($C_b$) 134, respectively.

In an embodiment, the capacitance value of the first capacitor 122, a capacitance value of the second capacitor 124, a capacitance value of the third capacitor 126, and a capacitance value of the fourth capacitor 128 are selected so that the third frequency ($f_P$) of the third resonance eigenmode is equal to the sum of the first frequency ($f_S$) of the first resonance eigenmode plus the second frequency ($f_I$) of the second resonance eigenmode.

In an embodiment, the quantum-mechanical non-linear circuit 200 further includes a seventh capacitor ($C_{cc}$) 142 connected to the first node 1 of the bridge circuit 110; an eight capacitor ($C_{ca}$) 144 connected to the first node 1 of the bridge circuit 110 and to the fifth capacitor ($C_a$) 144; and a ninth capacitor ($C_{cb}$) 146 connected to the third node 3 of the bridge circuit 110 and to the sixth capacitor ($C_b$) 134. In an embodiment, the quantum-mechanical non-linear circuit 200 also includes a tenth capacitor ($C_{cc}$) 143 that is connected to the second node 2 of the bridge circuit 110.

The seventh capacitor 142, the eighth capacitor 144 and ninth capacitor 146 are selected to satisfy a frequency hierarchy conduction such that:

1. a coupling constant between the first, the second and the third eigenmodes $g_3$ is less than decay rates $\gamma_S$ and $\gamma_I$ of the first and second eigenmodes, respectively, to corresponding external feedlines ($g_3 < \gamma_I \sim \gamma_S$); and
2. the coupling constant between the first, the second and the third eigenmodes $g_3$ is greater than a decay rate $\gamma_P$ of the third eigenmode to a corresponding external feedline ($g_3 > \gamma_P$).

Figure 4:
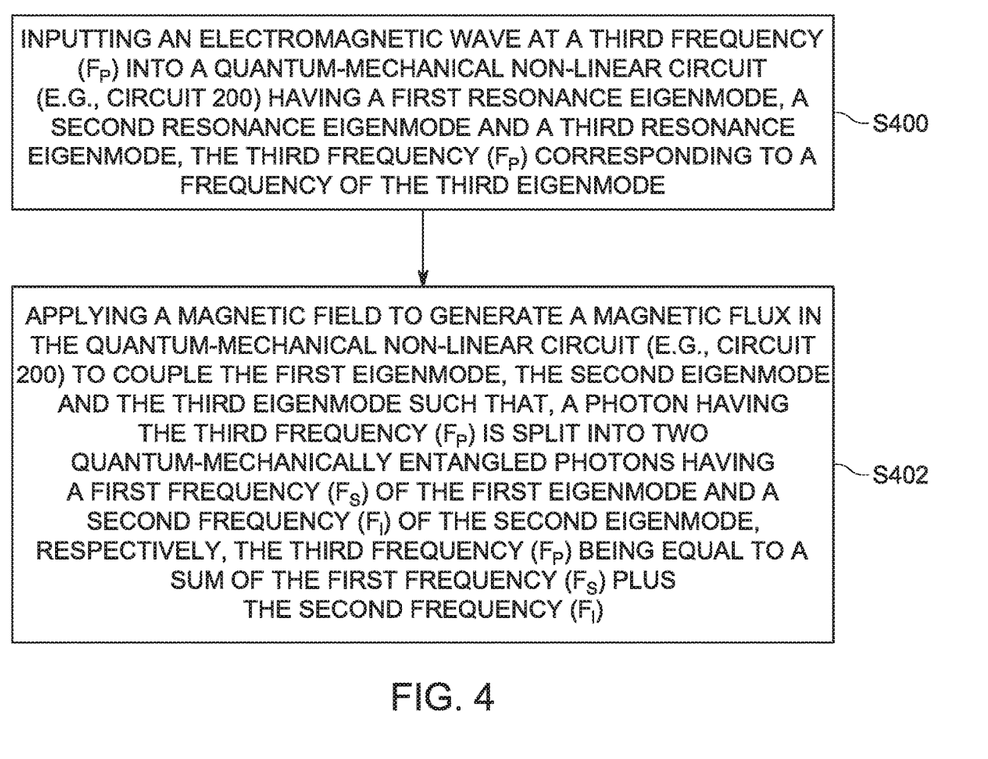
FIG. 4 is a flow diagram of a method for generating a quantum-mechanical entangled photon-pair, according to an embodiment of the present invention.

FIG. 4 is a flow diagram of a method for generating a quantum-mechanical entangled photon-pair, according to an embodiment of the present invention. The method includes inputting an electromagnetic wave at a third frequency ($f_P$) into a quantum-mechanical non-linear circuit (e.g., circuit 200) having a first resonance eigenmode, a second resonance eigenmode and a third resonance eigenmode, the third frequency ($f_P$) corresponding to a frequency of the third eigenmode, at S400. The method also includes applying a magnetic field to generate a magnetic flux (for example, using the source of magnetic flux 112) in the quantum-mechanical non-linear circuit (e.g., circuit 200) to couple the first eigenmode, the second eigenmode and the third eigenmode such that, a photon having the third frequency ($f_P$) is split into two quantum-mechanically entangled photons having a first frequency ($f_S$) of the first eigenmode and a second frequency ($f_I$) of the second eigenmode, respectively, the third frequency ($f_P$) being equal to a sum of the first frequency ($f_s$) plus the second frequency ($f_I$), at S402.

In an embodiment, the method includes selecting the first frequency ($f_S$) and the second frequency ($f_I$) by selecting capacitance values of capacitors ($C_a$) 132 and ($C_b$) 134 in the quantum-mechanical non-linear circuit 200. In an embodiment, the method includes selecting the capacitance values of capacitors ($C_a$) 132 and ($C_b$) 134 in the quantum-mechanical non-linear circuit 200 given the desired first frequency ($f_S$) and second frequency ($f_I$) of the two quantum-mechanically entangled photons. In an embodiment, the capacitance values of capacitors ($C_a$) 132 and ($C_b$) 134 in the quantum-mechanical non-linear circuit 200 can be selected so that the desired first frequency ($f_S$) is equal to the second frequency ($f_I$).

In an embodiment, the method further includes selecting capacitance values of capacitors (Cc) 122, 124, 126 and 128 in the quantum-mechanical non-linear circuit 200 so that the third frequency ($f_P$) of the third resonance eigenmode is equal to the sum of the first frequency ($f_S$) of the first resonance eigenmode plus the second frequency ($f_I$) of the second resonance eigenmode, i.e., $f_P=f_S+f_I$.

In an embodiment, the method also includes selecting capacitance values of capacitors $C_{cc}$ 142, $C_{ca}$ 144 and $C_{cb}$ 146 in the quantum-mechanical non-linear circuit 200 so as to satisfy a frequency hierarchy conduction such that a coupling constant $g_3$ between the first, the second and third eigenmodes is less than a decay rate $\gamma_S$ of the first eigenmode to a corresponding external feedline and a decay rate $\gamma_I$ of the second eigenmode to a corresponding external feedline, and the coupling constant $g_3$ between the first, the second and third eigenmodes is greater than a decay rate $\gamma_P$ of the third eigenmode to a corresponding external feedline.

A quantum-mechanical photon-pair generator that emits quantum-mechanical entangled photon-pairs on demand can be useful in remote quantum entanglement of superconducting qubits, quantum communication, quantum cryptography.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

I claim:

1. A quantum-mechanical photon-pair generator, comprising:
  a first Josephson junction, a second Josephson junction electrically connected to the first Josephson junction, a third Josephson junction electrically connected to the second Josephson junction and a fourth Josephson junction electrically connected to the third Josephson junction and the first Josephson junction such that the first, second, third and fourth Josephson junctions are connected in a bridge circuit having a first resonance eigenmode, a second resonance eigenmode and a third resonance eigenmode;
  a source of magnetic flux arranged proximate said bridge circuit, said source of magnetic flux is configured to provide, during operation, a magnetic flux through said bridge circuit to cause coupling between said first, second and third resonance eigenmodes when said third resonance eigenmode is excited;
  a first electromagnetic resonator electrically connected to said first and fourth Josephson junctions at a first node therebetween and to said second and third Josephson junctions at a second node therebetween;
  a second electromagnetic resonator electrically connected to said first and second Josephson junctions at a third node therebetween and to said third and fourth Josephson junctions at a fourth node therebetween;
  a third microwave resonator connected to said first and fourth Josephson junctions at the first node therebetween and to said second and third Josephson junctions at the second node therebetween;
  wherein said first electromagnetic resonator has an eigenmode in resonance with said first resonance eigenmode of said bridge circuit;
  wherein said second electromagnetic resonator has an eigenmode in resonance with said second resonance eigenmode of said bridge circuit;
  wherein said third electromagnetic resonator has an eigenmode in resonance with said third resonance eigenmode of said bridge circuit;
  wherein a third frequency of said third resonance eigenmode is equal to a sum of a first frequency of said first resonance eigenmode plus a second frequency of said second resonance eigenmode such that, during operation, a photon having said third frequency is split into two quantum-mechanically entangled photons having said first and second frequencies, respectively.

2. The quantum-mechanical photon-pair generator according to claim 1, wherein said first electromagnetic resonator, said second electromagnetic resonator and said third electromagnetic resonator are microwave resonators.

3. The quantum-mechanical photon-pair generator according to claim 1, wherein the first frequency of the first resonance eigenmode, the second frequency of the second resonance eigenmode, and the third frequency of the third resonance eigenmode are in the microwave frequency range.

4. The quantum-mechanical photon-pair generator according to claim 1, further comprising:
  a first capacitor ($C_c$) connected in parallel with the first Josephson junction;
  a second capacitor ($C_c$) connected in parallel with the second Josephson junction;
  a third capacitor ($C_c$) connected in parallel with the third Josephson Junction; and
  a fourth capacitor ($C_c$) connected in parallel with the fourth Josephson junction.

5. The quantum-mechanical photon-pair generator according to claim 4, further comprising:
  a fifth capacitor ($C_a$) connected in parallel with the bridge circuit at the first node and the second node of said bridge circuit; and
  a sixth capacitor ($C_b$) connected in parallel with the bridge circuit at the third node and the fourth node of said bridge circuit.

6. The quantum-mechanical photon-pair generator according to claim 5, wherein the first frequency and the second frequency depend on capacitance values of the fifth capacitor ($C_a$) and the sixth capacitor ($C_b$) and the first frequency and the second frequency are selected by selecting capacitance values of the fifth capacitor ($C_a$) and the sixth capacitor ($C_b$), respectively.

7. The quantum-mechanical photon-pair generator according to claim 6, wherein a capacitance value of the first capacitor, a capacitance value of the second capacitor, a capacitance value of the third capacitor, and a capacitance value of the fourth capacitor are selected so that the third frequency of the third resonance eigenmode is equal to the sum of the first frequency of the first resonance eigenmode plus the second frequency of the second resonance eigenmode.

8. The quantum-mechanical photon-pair generator, according to claim 5, further comprising:
   a seventh capacitor ($C_{cc}$) connected to a third resonator feedline coupled to the third resonator and to the first node of the bridge circuit;
   an eighth capacitor ($C_{ca}$) connected to a first resonator feedline coupled to the first resonator and to the first node of the bridge circuit;
   a ninth capacitor ($C_{cb}$) connected to a second resonator feedline coupled to the second resonator and to the third node of the bridge circuit; and
   a tenth capacitor ($C_{cc}$) connected to a third resonator feedline coupled to the third resonator and to the second node of the bridge circuit,
   wherein the seventh, eighth, ninth and tenth capacitors are selected to satisfy a frequency hierarchy conduction such that:
   a coupling constant between the first, the second and third eigenmodes is less than decay rates of the first and second eigenmodes to corresponding external feedlines, and
   the coupling constant between the first, the second and third eigenmodes is greater than a decay rate of the third eigenmode to a corresponding external feedline.

9. The quantum-mechanical photon-pair generator according to claim 1, wherein the first, second and third microwave resonators are coplanar strip-line resonators or micro-strip resonators.

10. The quantum-mechanical photon-pair generator according to claim 1, wherein the first, second and third microwave resonators are compact lumped-element resonators or three-dimensional cavities.

11. The quantum-mechanical photon-pair generator according to claim 1, wherein said source of magnetic flux is a current-carrying element to provide an electromagnetic source of magnetic flux that flux-biases the bridge circuit.

12. The quantum-mechanical photon-pair generator according to claim 1, wherein said source of magnetic flux is a magnetic material to provide an electromagnetic source of magnetic flux that flux-biases the bridge circuit.

13. The superconducting quantum-mechanical device according to claim 1, wherein said source of magnetic flux provides a half of flux quantum ($\varphi_0/2$).

14. The superconducting quantum-mechanical device according to claim 1,
   wherein said first frequency, said second frequency and said third frequency are in the microwave frequency range.

15. A quantum-mechanical non-linear circuit, comprising:
   a first Josephson junction;
   a second Josephson junction electrically connected to the first Josephson junction;
   a third Josephson junction electrically connected to the second Josephson junction; and
   a fourth Josephson junction electrically connected to the third Josephson junction and the first Josephson junction, such that the first, second, third and fourth Josephson junctions are connected in a bridge circuit;
   a first capacitor ($C_c$) connected in parallel with the first Josephson junction;
   a second capacitor ($C_c$) connected in parallel with the second Josephson junction;
   a third capacitor ($C_c$) connected in parallel with the third Josephson Junction;
   a fourth capacitor ($C_c$) connected in parallel with the fourth Josephson junction;
   a fifth capacitor ($C_a$) connected in parallel with the bridge circuit at a first node between the first Josephson junction and the fourth Josephson junction and a second node between the second Josephson junction and the third Josephson junction; and
   a sixth capacitor ($C_b$) connected in parallel with the bridge circuit at the third node between the first Josephson junction and the second Josephson junction and a fourth node between the third Josephson junction and the fourth Josephson junction,
   wherein the quantum-mechanical non-linear circuit has a first resonance eigenmode, a second resonance eigenmode and a third resonance eigenmode, and
   wherein a third frequency of said third resonance eigenmode is equal to a sum of a first frequency of said first resonance eigenmode plus a second frequency of said second resonance eigenmode such that, during operation, a photon having said third frequency is split into two quantum-mechanically entangled photons having said first and second frequencies, respectively.

16. The quantum-mechanical non-linear circuit according to claim 15, wherein, in operation, the first resonance eigenmode, the second resonance eigenmode and the third resonance eigenmode are coupled by applying a magnetic field to generate a magnetic flux through said bridge circuit when said third resonance eigenmode is excited.

17. The quantum-mechanical non-linear circuit according to claim 15, wherein the first frequency and the second frequency depend on capacitance values of the fifth capacitor ($C_a$) and the sixth capacitor ($C_b$), respectively, and the first frequency and the second frequency are selected by selecting capacitance values of the fifth capacitor ($C_a$) and the sixth capacitor ($C_b$), respectively.

18. The quantum-mechanical non-linear circuit according to claim 17, wherein a capacitance value of the first capacitor, a capacitance value of the second capacitor, a capacitance value of the third capacitor, and a capacitance value of the fourth capacitor are selected so that the third frequency of the third resonance eigenmode is equal to the sum of the first frequency of the first resonance eigenmode plus the second frequency of the second resonance eigenmode.

19. The quantum-mechanical non-linear circuit, according to claim 15, further comprising:
   a seventh capacitor ($C_{cc}$) connected to the first node of the bridge circuit;
   an eight capacitor ($C_{ca}$) connected to the first node of the bridge circuit and to the fifth capacitor ($C_a$);
   a ninth capacitor ($C_{cb}$) connected to the third node of the bridge circuit and to the sixth capacitor ($C_b$); and
   a tenth capacitor ($C_{cc}$) connected to the second node of the bridge circuit, wherein the seventh, eighth, ninth and tenth capacitors are selected to satisfy a frequency hierarchy conduction such that:
a coupling constant between the first, the second and third eigenmodes is less than decay rates of the first and second eigenmodes to corresponding external feedlines, and
the coupling constant between the first, the second and third eigenmodes is greater than a decay rate of the third eigenmode to a corresponding external feedline.

20. A method for generating a quantum-mechanical entangled photon-pair, comprising:
inputting an electromagnetic wave at a third frequency into a quantum-mechanical non-linear circuit having a first resonance eigenmode, a second resonance eigenmode and a third resonance eigenmode, the third frequency corresponding to a frequency of said third eigenmode; and
applying a magnetic field to generate a magnetic flux in said quantum-mechanical non-linear circuit to couple said first eigenmode, said second eigenmode and said third eigenmode such that, a photon having said third frequency is split into two quantum-mechanically entangled photons having a first frequency of said first eigenmode and a second frequency of said second eigenmode, respectively, the third frequency being equal to a sum of the first frequency plus the second frequency.

21. The method according to claim 20, further comprising:
selecting the first frequency and the second frequency by selecting capacitance values of first capacitors in the quantum-mechanical non-linear circuit.

22. The method according to claim 21, further comprising:
selecting capacitance values of second capacitors in the quantum-mechanical non-linear circuit so that the third frequency of the third resonance eigenmode is equal to the sum of the first frequency of the first resonance eigenmode plus the second frequency of the second resonance eigenmode.

23. The method according to claim 21, further comprising:
selecting capacitance values of third capacitors in the quantum-mechanical non-linear circuit so as to satisfy a frequency hierarchy conduction such that a coupling constant between the first, the second and third eigenmodes is less than a decay rate of the first eigenmode to a corresponding external feedline and a decay rate of the second eigenmode to a corresponding external feedline, and the coupling constant between the first, the second and third eigenmodes is greater than a decay rate of the third eigenmode to a corresponding external feedline.

* * * * *